(12) United States Patent
Lu et al.

(10) Patent No.: US 11,641,192 B2
(45) Date of Patent: May 2, 2023

(54) LEVEL SHIFTER

(71) Applicant: AU Optronics Corporation, Hsin-Chu (TW)

(72) Inventors: Yi-Chen Lu, Hsin-Chu (TW); Hsu-Chi Li, Hsin-Chu (TW); Yi-Jan Chen, Hsin-Chu (TW); Boy-Yiing Jaw, Hsin-Chu (TW); Chin-Tang Chuang, Hsin-Chu (TW); Chung-Hung Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/517,093

(22) Filed: Nov. 2, 2021

(65) Prior Publication Data
US 2022/0368319 A1  Nov. 17, 2022

(30) Foreign Application Priority Data

May 12, 2021  (TW) .................................. 110117124

(51) Int. Cl.
*H03K 3/356* (2006.01)
*H03K 17/10* (2006.01)
*H03K 19/0185* (2006.01)

(52) U.S. Cl.
CPC ..... *H03K 3/356113* (2013.01); *H03K 17/102* (2013.01); *H03K 19/018521* (2013.01)

(58) Field of Classification Search
CPC ........... H03K 3/356113; H03K 17/102; H03K 19/018521; H03K 3/356104; H03K 3/35613; H03K 19/018507; H03K 19/018528; H03K 19/0185; H03K 19/0175

See application file for complete search history.

(56) References Cited

U.S. PATENT DOCUMENTS

| | | | |
|---|---|---|---|
| 5,821,800 A | 10/1998 | Le et al. | |
| 8,742,821 B2 | 6/2014 | Liu | |
| 10,686,444 B1 | 6/2020 | Chen et al. | |
| 2008/0164931 A1* | 7/2008 | Kimura | H03K 19/018528 327/333 |
| 2010/0001787 A1 | 1/2010 | Brunsilius et al. | |
| 2011/0025407 A1 | 2/2011 | Brunsilius et al. | |
| 2014/0108826 A1 | 4/2014 | Yu | |
| 2014/0375373 A1 | 12/2014 | Sul et al. | |

* cited by examiner

*Primary Examiner* — Jung Kim
(74) *Attorney, Agent, or Firm* — WPAT, P.C.

(57) ABSTRACT

A level shifter includes a buffer circuit, a first shift circuit, and a second shift circuit. The buffer circuit provides a first signal and a first inverted signal to the first shift circuit, such that the first shift circuit provides a second signal and a second inverted signal to the second shift circuit. The second shift circuit generates a plurality of output signals according to the second signal and the second inverted signal. The first shift circuit includes a plurality of first stacking transistors and a first voltage divider circuit. The first voltage divider circuit is electrically coupled between a first system high voltage terminal and a system low voltage terminal. The first voltage divider circuit is configured to provide a first inner bias to gate terminals of the first stacking transistors.

10 Claims, 5 Drawing Sheets

LEVEL SHIFTER

RELATED APPLICATIONS

This application claims priority to Taiwan Application Serial Number 110117124, filed May 12, 2021, which is herein incorporated by reference.

BACKGROUND

Field of Invention

The present disclosure relates to a level shifter. More particularly, the present disclosure relates to a level shifter that realizes an increased voltage difference between an input voltage domain and an output voltage domain.

Description of Related Art

In today's technology, a level-shifting circuit is utilized in a circuitry that demands different voltage requirements among some circuits. A level shifter can usually receive an input signal switched in a first voltage domain, and output an output signal corresponding to the input signal and switched in a second voltage domain. The second voltage domain may be different from the first voltage domain. How to increase the shift range of the output signal has become an important subject.

For the foregoing reason, there is a need to solve the above-mentioned problem by providing a level shifter.

SUMMARY

One embodiment of the present disclosure is to provide a level shifter. The level shifter includes a buffer circuit, a first shift circuit, and a second shift circuit. The buffer circuit provides a first signal and a first inverted signal of opposite phases. The first shift circuit is electrically coupled between a first system high voltage terminal and a system low voltage terminal, and the first shift circuit is configured to provide a second signal and a second inverted signal of the opposite phases according to the first signal and the first inverted signal. The first shift circuit comprises a plurality of first stacking transistors and a first voltage divider circuit. The first voltage divider circuit is electrically coupled between the first system high voltage terminal and the system low voltage terminal. The first voltage divider circuit is configured to provide a first inner bias to gate terminals of the first stacking transistors. The second shift circuit is electrically coupled between a second system high voltage terminal and the system low voltage terminal, and the second shift circuit generates a plurality of output signals according to the second signal and the second inverted signal.

The other embodiment of the present disclosure is to provide a level shifter. The level shifter includes a buffer circuit, a first shift circuit and a second shift circuit. The buffer circuit provides a first signal and a first inverted signal of opposite phases. The first shift circuit is electrically coupled between a first system high voltage terminal and a system low voltage terminal, and the first shift circuit being configured to provide a second signal and a second inverted signal of the opposite phases according to the first signal and the first inverted signal. The second shift circuit is electrically coupled between a second system high voltage terminal and the system low voltage terminal. The second shift circuit generates a plurality of output signals according to the second signal and the second inverted signal. The first signal and the first inverted signal operate in a positive voltage domain, and the second signal and the second inverted signal operate in a negative voltage domain.

In summary, the present disclosure utilizes the first voltage divider circuit to provide the first inner bias to the first stacking transistors. In this manner, the circuit area for generating control signals is reduced.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

Figure 1:
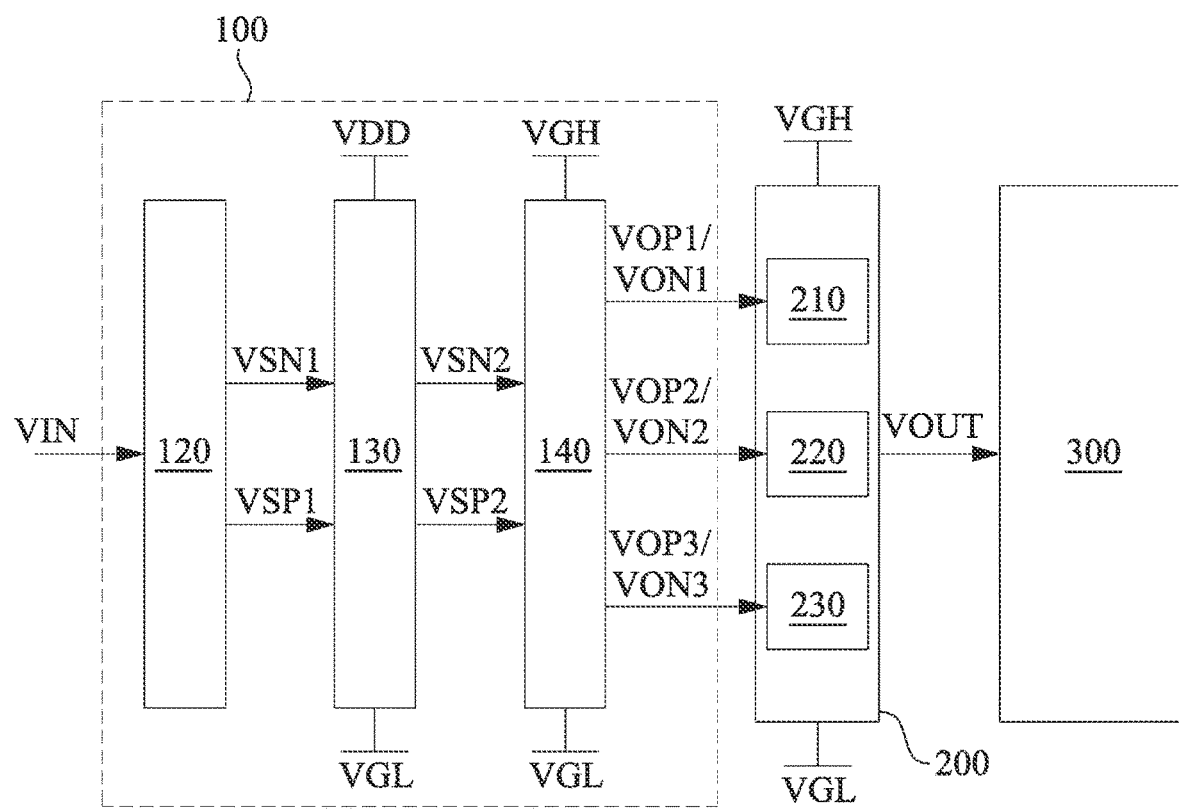
FIG. 1 depicts a functional block diagram of a circuit according to one embodiment of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. Description of the operation does not intend to limit the operation sequence. Any structures resulting from recombination of elements with equivalent effects are within the scope of the present disclosure. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

Throughout the specification and drawings, indexes 1~n may be used in the reference numbers of components and signals for ease of referring to respective components and signals. The use of indexes 1~n does not intend to restrict the count of components and signals to any specific number. In the specification and drawings, if a reference number of a particular component or signal is used without using the index, it means that the reference number is used to refer to any unspecific component or signal of corresponding component group or signal group.

Furthermore, it should be understood that the terms, "comprising", "including", "having", "containing", "involving" and the like, used herein are open-ended, that is, including but not limited to. It will be understood that, as used herein, the phrase "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

A description is provided with reference to FIG. 1. FIG. 1 depicts a functional block diagram of a circuit according to one embodiment of the present disclosure. As shown in FIG. 1, a level shifter 100 is configured to provide three pairs of output signals VOP1/VON1, VOP2/VON2 and VOP3/VON3 to an input/output circuit 200. In one embodiment, the input/output circuit 200 includes internal circuit elements 210, 220, 230. The three internal circuit elements 210, 220, and 230 need to operate in different voltage domains, respectively. For example, a control signal required by the internal circuit element 210 is switched between +9~12 volts (V), 3~6 volts, and 0~−3 volts. In practical applications, the input/output circuit 200 can be used as a buffer circuit in a gate driver.

The input/output circuit 200 is electrically coupled between a second system high voltage terminal VGH and a system low voltage terminal VGL. The input/output circuit 200 uses a potential of the second system high voltage terminal VGH or a potential of the system low voltage terminal VGL as an output signal VOUT and transmits the output signal VOUT to a gate driver in the display panel according to the output signals VOP1/VON1, VOP2/VON2, and VOP3/VON3, so as to drive light-emitting elements of the display panel 300.

In one embodiment, the level shifter 100 may be configured to provide the output signals VOP1/VON1 with a voltage domain from 8.91 volts to 12 volts, the output signals VOP2/VON2 with a voltage domain from 2.92 volts to 6.03 volts, and the output signals VOP3/VON3 with a voltage domain from −3 volts to 0.028 volts.

The level shifter 100 includes a buffer circuit 120, a first shift circuit 130, and a second shift circuit 140. The buffer circuit 120 is configured to receive an input signal VIN and provide a first signal VSP1 and a first inverted signal VSN1 to the first shift circuit 130. The first signal VSP1 and the first inverted signal VSN1 operate in a positive voltage domain, from 0 volts to 1.8 volts, and the first signal VSP1 and the first inverted signal VSN1 are signals of opposite phases. For example, when the first signal VSP1 is switched from 0 volts to 1.8 volts, the first inverted signal VSN1 is switched from 1.8 volts to 0 volts.

The first shift circuit 130 is electrically coupled between a first system high voltage terminal VDD and the system low voltage terminal VGL. The first shift circuit 130 is configured to provide a second signal VSP2 and a second inverted signal VSN2 to the second shift circuit 140 according to the first signal VSP1 and the first inverted signal VSN1. The second signal VSP2 and the second inverted signal VSN2 operate in a negative voltage domain, from −0.58 volts to −3 volts. The second signal VSP2 and the first signal VSP1 are signals of an identical phase. The second inverted signal VSN2 and the first inverted signal VSN1 are signals of an identical phase. The second inverted signal VSN2 has an opposite phase relative to the second signal VSP2. For example, when the first signal VSP1 is switched from 0 volts to 3 volts, the second signal VSP2 is switched from −3 volts to −0.58 volts, and the second inverted signal VSN2 is switched from −0.58 volts to −3 volts. The detailed operation is further described in the subsequent embodiments.

The second shift circuit 140 is electrically coupled between the second system high voltage terminal VGH and the system low voltage terminal VGL. The second shift circuit 140 is configured to generate the output signals VOP1/VON1, VOP2/VON2, and VOP3/VON3 according to the second signal VSP2 and the second inverted signal VSN2, and provide the output signals VOP1/VON1, VOP2/VON2, and VOP3/VON3 to the input/output circuit 200. The output signals VOP1 and VON1 operate in the voltage domain from 8.91 volts to 12 volts, the output signals VOP2 and VON2 operate in the voltage domain from 2.92 volts to 6.03 volts, and the output signals VOP3 and VON3 operate in the voltage domain from 0.028 volts to −3 volts. The second signal VSP2 and the output signals VOP1, VOP2, and VOP3 are signals of the identical phase. The second inverted signal VSN2 and the output signals VON1, VON2, and VON3 are signals of the identical phase. The output signal VON1 and the output signal VOP1 are signals of the opposite phases, the output signal VON2 and the output signal VOP2 are signals of the opposite phases, and the output signal VON3 and the output signals VOP3 are signals of the opposite phases.

For example, when the second inverted signal VSN2 is switched from −0.58 volts to −3 volts, the output signal VOP1 is switched from 8.91 volts to 12 volts and the output signal VON2 is switched from 6.03 volts to 2.92 volts, the output signal VOP2 is switched from 2.92 volts to 6.03 volts and the output signal VON1 is switched from 12 volts to 8.91 volts, and the output signal VOP3 is switched from −3 volts to 0.028 volts and the output signal VON3 is switched from 0.028 volts to −3 volts. The detailed operation is further described in the subsequent embodiments.

In the embodiments of the present disclosure, the potential of the system low voltage terminal VGL can be set to a negative value, so as to increase a shift range of the output signals VOP1, VOP2, and VOP3 of the level shifter 100. In another embodiment, when the level shifter 100 is integrated with and applied to a gate driver, the potential operation interval of the gate driver can be increased. When the output voltage is set to a negative output voltage, the switches of the display circuit can be turned off more accurately to reduce the leakage currents. When the output voltage is set to a positive high output voltage, it is helpful in increasing the driving current of the light-emitting elements.

Figure 2A:
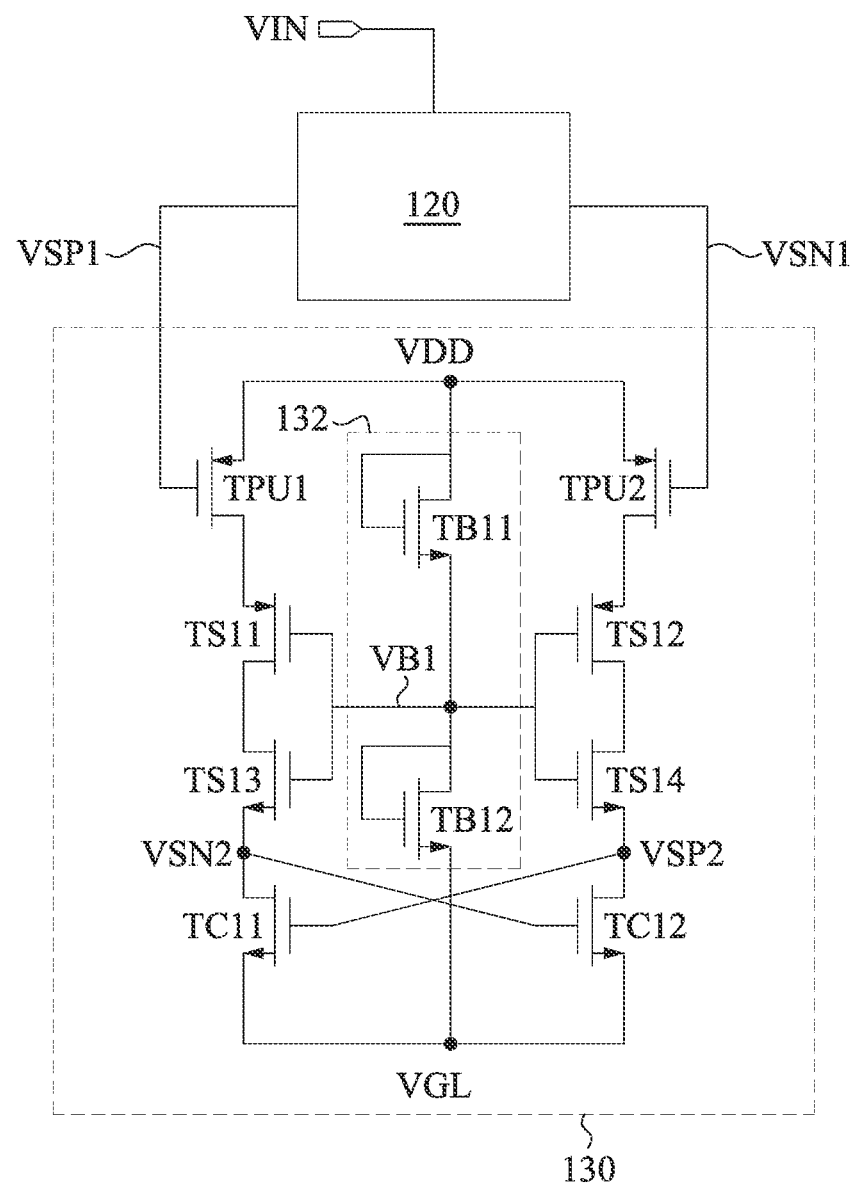
FIG. 2A depicts a circuit structure diagram of a first shift circuit of the level shifter in FIG. 1.
Figure 2B:
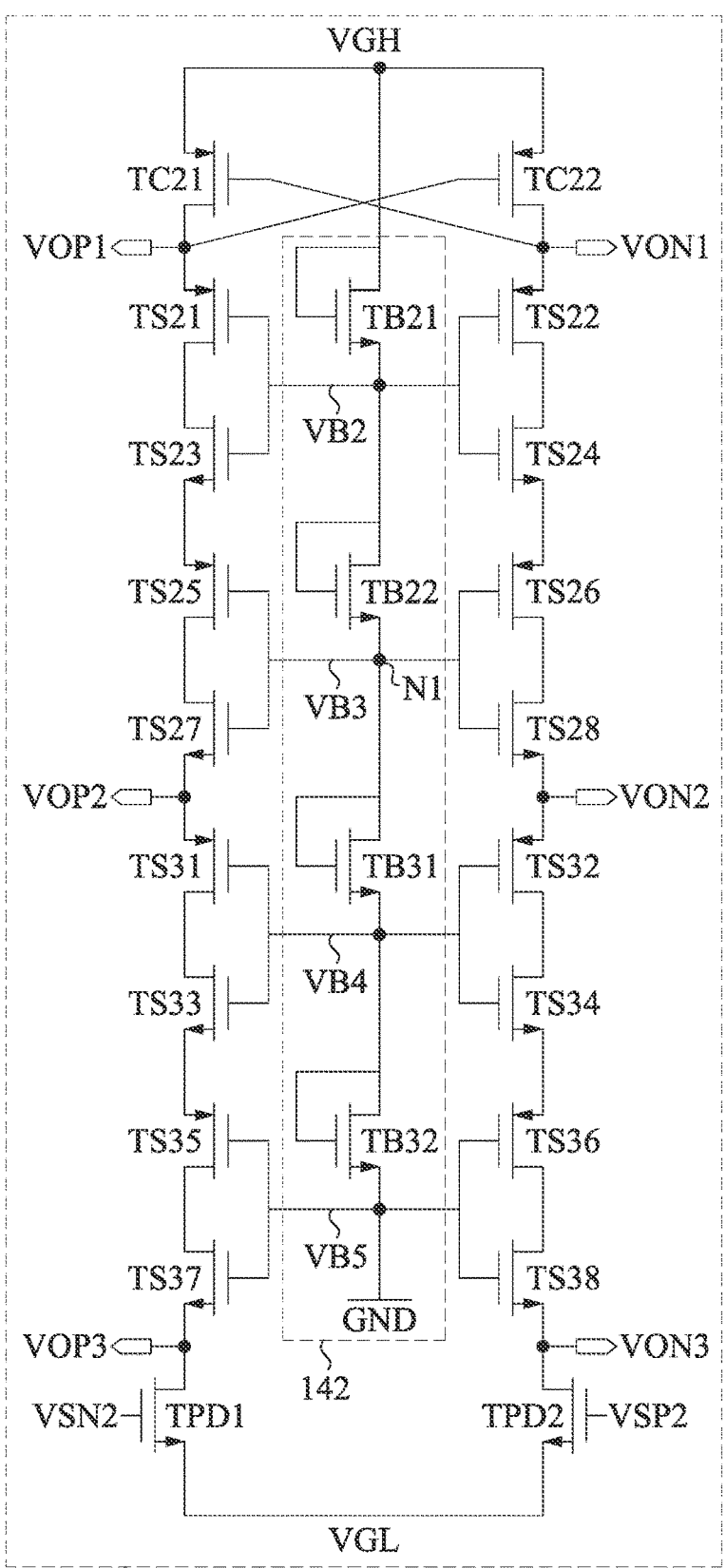
FIG. 2B depicts a circuit structure diagram of a second shift circuit of the level shifter in FIG. 1.

A description is provided with reference to FIG. 2A and FIG. 2B. FIG. 2A depicts a circuit structure diagram of the first shift circuit 130 of the level shifter 100 in FIG. 1. FIG. 2B depicts a circuit structure diagram of the second shift circuit 140 of the level shifter 100 in FIG. 1. As shown in FIG. 2A and FIG. 2B, the level shifter 100 includes the buffer circuit 120, the first shift circuit 130, and the second shift circuit 140.

The potential of the second system high voltage terminal VGH is much higher than a potential of the first system high voltage terminal VDD, so that the second shift circuit 140 can generate the shifted output signal VOP1 and VON1, VOP2 and VON2, VOP3 and VON3 according to the second signal VSP2 and the second inverted signal VSN2. In the present disclosure, the potential of the second system high voltage terminal VGH is implemented by using 12 volts, the potential of the first system high voltage terminal VDD is implemented by using 1.8 volts, and the potential of the system low voltage terminal VGL is implemented by using −3 volts.

It is noted that when the potential of the system low voltage terminal VGL is set to the negative value, the N-type transistor adopted in the level shifter 100 can be implemented by an N-type metal oxide semiconductor with a deep N-well to avoid breakdown of PN junctions of the N-type transistor. The deep N-well of the N-type transistor in the level shifter 100 is electrically coupled to the second system high voltage terminal VGH, so that the PN junction of the P-type substrate and the deep N-well is not forward conducted, the PN junction of the P-well and the deep N-well is not forward conducted, and the voltages across the PN junctions in the N-type transistor are both within the allowable ranges. In this manner, the system low voltage terminal VGL of the level shifter 100 is set to the negative value (for example, −3 volts), and the N-type transistor can also withstand cross voltages in the level shifter 100. In addition, the base terminal of each N-type transistor of the present disclosure is electrically coupled to its source terminal to eliminate the body effect.

As shown in FIG. 2A, the first shift circuit 130 includes pull-up transistors TPU1 and TPU2, first stacking transistors TS11~TS14, first cross-coupled transistors TC11 and TC12, and a first voltage divider circuit 132. The first stacking transistors TS13 and TS14 and the first cross-coupled transistors TC11 and TC12 are N-type transistors. The pull-up transistors TPU1 and TPU2 and the first stacking transistors TS11 and TS12 are P-type transistors.

The first voltage divider circuit 132 is electrically coupled between the first system high voltage terminal VDD and the system low voltage terminal VGL. The first voltage divider circuit 132 is configured to provide a first inner bias VB1.

The pull-up transistors TPU1 and TPU2 are electrically coupled to the first system high voltage terminal VDD. The pull-up transistors TPU1 and TPU2 are enabled respectively according to the first signal VSP1 and the first inverted signal VSN1.

The first cross-coupled transistors TC11 and TC12 are electrically coupled to the system low voltage terminal VGL. The first cross-coupled transistors TC11 and TC12 are enabled respectively according to the second inverted signal VSN2 and the second signal VSP2.

The first stacking transistors TS11-TS14 are electrically coupled between the pull-up transistors TPU1 and TPU2 and the first cross-coupled transistors TC11 and TC12. Gate terminals of the first stacking transistors TS11-TS14 are configured to receive the first inner bias VB1.

Each of the above transistors has a first terminal, a second terminal, and a gate terminal (Gate). When the first terminal of one of the transistors is a drain terminal (source terminal), the second terminal of that transistor is a source terminal (drain terminal).

In greater detail, the first voltage divider circuit 132 includes first voltage divider transistors TB11 and TB12. The first voltage divider transistors TB11 and TB12 are N-type transistors. The first voltage divider transistors TB11 and TB12 are electrically connected in series between the first system high voltage terminal VDD and the system low voltage terminal VGL. A gate terminal and a drain terminal of each of the first voltage divider transistors TB11 and TB12 are electrically coupled.

The first terminal (source terminal) of the pull-up transistor TPU1 is electrically coupled to the first system high voltage terminal VDD, the second terminal of the pull-up transistor TPU1 is electrically coupled to the first terminal (source terminal) of the first stacking transistor TS11, and the gate terminal of the pull-up transistor TPU1 is configured to receive the first signal VSP1. The second terminal of the first stacking transistor TS11 is electrically coupled to the first terminal of the first stacking transistor TS13. The gate terminal of the first stacking transistor TS11 is electrically coupled to the gate terminal of the first stacking transistor TS13. The gate terminals of the first stacking transistors TS11 and TS13 are configured to receive the first inner bias VB1.

The second terminal of the first stacking transistor TS13 is configured to provide the second inverted signal VSN2, and the second terminal of the first stacking transistor TS13 is electrically coupled to the first terminal of the first cross-coupled transistor TC11. The second terminal of the first cross-coupled transistor TC11 is electrically coupled to the system low voltage terminal VGL. The gate terminal of the first cross-coupled transistor TC11 is electrically coupled to the second terminal of the first stacking transistor TS14, and the gate terminal of the first cross-coupled transistor TC11 is configured to receive the second signal VSP2.

The first terminal (source terminal) of the pull-up transistor TPU2 is electrically coupled to the first system high voltage terminal VDD, the second terminal of the pull-up transistor TPU2 is electrically coupled to the first terminal (source terminal) of the first stacking transistor TS12, and the gate terminal of the pull-up transistor TPU2 is configured to receive the first inverted signal VSN1. The second terminal of the first stacking transistor TS12 is electrically coupled to the first terminal of the first stacking transistor TS14. The gate terminal of the first stacking transistor TS12 is electrically coupled to the gate terminal of the first stacking transistor TS14. The gate terminals of the first stacking transistors TS12 and TS14 are configured to receive the first inner bias VB1.

The second terminal of the first stacking transistor TS14 is configured to provide the second signal VSP2, and the second terminal of the first stacking transistor TS14 is electrically coupled to the first terminal of the first cross-coupled transistor TC12. The second terminal of the first cross-coupled transistor TC12 is electrically coupled to the system low voltage terminal VGL. The gate terminal of the first cross-coupled transistor TC12 is electrically coupled to the second terminal of the first stacking transistor TS13, and the gate terminal of the first cross-coupled transistor TC12 is configured to receive the second inverted signal VSN2.

As shown in FIG. 2B, the second shift circuit 140 includes pull-down transistors TPD1 and TPD2, second stacking transistors TS21-TS28, third stacking transistors TS31-TS38, second cross-coupled transistors TC21 and TC22, and a second voltage divider circuit 142. The pull-down transistors TPD1 and TPD2, the second stacking transistors TS23, TS24, TS27, TS28, and the third stacking transistors TS33, TS34, TS37, TS38 are N-type transistors. The second cross-coupled transistors TC21 and TC22, the second stacking transistors TS21, TS22, TS25, TS26, and the third stacking transistors TS31, TS32, TS35, TS36 are P-type transistors.

The second voltage divider circuit 142 is electrically coupled between the second system high voltage terminal VGH and a ground terminal GND. The second voltage divider circuit 142 includes second voltage divider transistors TB21 and TB22 and third voltage divider transistors TB31 and TB32. The second voltage divider transistors TB21 and TB22 are electrically coupled between the second system high voltage terminal VGH and a node N1. The third voltage divider transistors TB31 and TB32 are electrically coupled between the node N1 and the ground terminal GND. The second voltage divider circuit 142 includes the second voltage divider transistors TB21 and TB22 and the third voltage divider transistors TB31 and TB32, which are N-type transistors. The second voltage divider transistors TB21 and TB22 in the second voltage divider circuit 142 are configured to provide second inner biases VB2 and VB3. The third voltage divider transistors TB31 and TB32 in the second voltage divider circuit 142 are configured to provide second inner biases VB4 and VB5.

The second cross-coupled transistors TC21 and TC22 are electrically coupled between the second system high voltage terminal VGH and two first output terminals. The two first output terminals are respectively configured to output the output signals VOP1 and VON1. The output signals VOP1 and VON1 operate in the same voltage domain, and the output signal VON1 and the output signal VOP1 are signals of the opposite phases. The second cross-coupled transistor TC21 is enabled according to the output signal VON1, and the second cross-coupled transistor TC22 is enabled according to the output signal VOP1.

The second stacking transistors TS21~TS28 are electrically coupled between the two first output terminals and two second output terminals. The two second output terminals are respectively configured to output the output signals VOP2 and VON2. The output signals VOP2 and VON2 operate in the same voltage domain, and the output signal VON2 and the output signal VOP2 are signals of the opposite phases. Gate terminals of the second stacking transistors TS21~TS24 are configured to receive the second inner bias VB2. Gate terminals of the second stacking transistors TS25~TS28 are configured to receive the second inner bias VB3.

The third stacking transistors TS31~TS38 are electrically coupled between the two second output terminals and two third output terminals. The two third output terminals are respectively configured to output the output signals VOP3 and VON3. The output signals VOP3 and VON3 operate in the same voltage domain, and the output signal VON3 and the output signal VOP3 are signals of the opposite phases. Gate terminals of the third stacking transistors TS31~TS34 are configured to receive the second inner bias VB4. Gate terminals of the third stacking transistors TS35~TS38 are configured to receive the second inner bias VB5.

The pull-down transistors TPD1 and TPD2 are electrically coupled between the two third output terminals and the system low voltage terminal VGL. The pull-down transistors TPD1 and TPD2 are enabled respectively according to the second inverted signal VSN2 and the second signal VSP2.

In greater detail, the second voltage divider circuit 142 includes second voltage divider transistors TB21 and TB22 and third voltage divider transistors TB31 and TB32. The second voltage divider transistors TB21 and TB22 and the third voltage divider transistors TB31 and TB32 are electrically connected in series between the second system high voltage terminal VGH and the ground terminal GND. A gate terminal and a drain terminal of each of the second voltage divider transistors TB21 and TB22 and the third voltage divider transistors TB31 and TB32 are electrically coupled.

A first terminal of the second cross-coupled transistor TC21 is electrically coupled to the second system high voltage terminal VGH. A second terminal of the second cross-coupled transistor TC21 is electrically coupled to a first terminal of the second stacking transistor TS21. A gate terminal of the second cross-coupled transistor TC21 is configured to receive the output signal VON1. That is, the second cross-coupled transistor TC21 is enabled according to the output signal VON1.

A second terminal of the second stacking transistor TS21 is electrically coupled to a first terminal of the second stacking transistor TS23. A gate terminal of the second stacking transistor TS21 is electrically coupled to a gate terminal of the second stacking transistor TS23. The gate terminals of the second stacking transistors TS21 and TS23 are configured to receive the second inner bias VB2.

A first terminal of the second stacking transistor TS25 is electrically coupled to a second terminal of the second stacking transistor TS23. A second terminal of the second stacking transistor TS25 is electrically coupled to a first terminal of the second stacking transistor TS27. A gate terminal of the second stacking transistor TS25 is electrically coupled to a gate terminal of the second stacking transistor TS27. The gate terminals of the second stacking transistors T25 and TS27 are configured to receive the second inner bias VB3.

A first terminal of the third stacking transistor TS31 is electrically coupled to a second terminal of the second stacking transistor TS27. A second terminal of the third stacking transistor TS31 is electrically coupled to a first terminal of the third stacking transistor TS33. A gate terminal of the third stacking transistor TS31 is electrically coupled to a gate terminal of the third stacking transistor TS33. The gate terminals of the third stacking transistor TS31 and TS33 are configured to receive the second inner bias VB4.

A first terminal of the third stacking transistor TS35 is electrically coupled to a second terminal of the third stacking transistor TS33. A second terminal of the third stacking transistor TS35 is electrically coupled to a first terminal of the third stacking transistor TS37. A gate terminal of the third stacking transistor TS35 is electrically coupled to a gate terminal of the third stacking transistor TS37. The gate terminals of the third stacking transistors T35 and TS37 are configured to receive the second inner bias VB5.

A first terminal of the pull-down transistor TPD1 is electrically coupled to a second terminal of the third stacking transistor TS37. A second terminal of the pull-down transistor TPD1 is electrically coupled to the system low voltage terminal VGL. A gate terminal of the pull-down transistor TPD1 is configured to receive the second inverted signal VSN2.

A first terminal of the second cross-coupled transistor TC22 is electrically coupled to the second system high voltage terminal VGH. A second terminal of the second cross-coupled transistor TC22 is electrically coupled to a first terminal of the second stacking transistor TS22. A gate terminal of the second cross-coupled transistor TC22 is configured to receive the output signal VOP1. That is, the second cross-coupled transistor TC22 is enabled according to the output signal VOP1.

A second terminal of the second stacking transistor TS22 is electrically coupled to a first terminal of the second stacking transistor TS24. A gate terminal of the second stacking transistor TS22 is electrically coupled to a gate terminal of the second stacking transistor TS24. The gate terminals of the second stacking transistors T22 and TS24 are configured to receive the second inner bias VB2.

A first terminal of the second stacking transistor TS26 is electrically coupled to a second terminal of the second stacking transistor TS24. A second terminal of the second stacking transistor TS26 is electrically coupled to a first terminal of the second stacking transistor TS28. A gate terminal of the second stacking transistor TS26 is electrically coupled to a gate terminal of the second stacking transistor TS28. The gate terminals of the second stacking transistors T26 and TS28 are configured to receive the second inner bias VB3.

A first terminal of the third stacking transistor TS32 is electrically coupled to a second terminal of the second stacking transistor TS28. A second terminal of the third stacking transistor TS32 is electrically coupled to a first terminal of the third stacking transistor TS34. A gate terminal of the third stacking transistor TS32 is electrically coupled to a gate terminal of the third stacking transistor TS34. The gate terminals of the third stacking transistor TS32 and TS34 are configured to receive the second inner bias VB4.

A first terminal of the third stacking transistor TS36 is electrically coupled to a second terminal of the third stacking transistor TS34. A second terminal of the third stacking transistor TS36 is electrically coupled to a first terminal of the third stacking transistor TS38. A gate terminal of the third stacking transistor TS36 is electrically coupled to a gate terminal of the third stacking transistor TS38. The gate terminals of the third stacking transistors T36 and TS38 are configured to receive the second inner bias VB5.

A first terminal of the pull-down transistor TPD2 is electrically coupled to a second terminal of the third stacking transistor TS38. A second terminal of the pull-down transistor TPD2 is electrically coupled to the system low voltage terminal VGL. A gate terminal of the pull-down transistor TPD2 is configured to receive the second signal VSP2.

Figure 3:
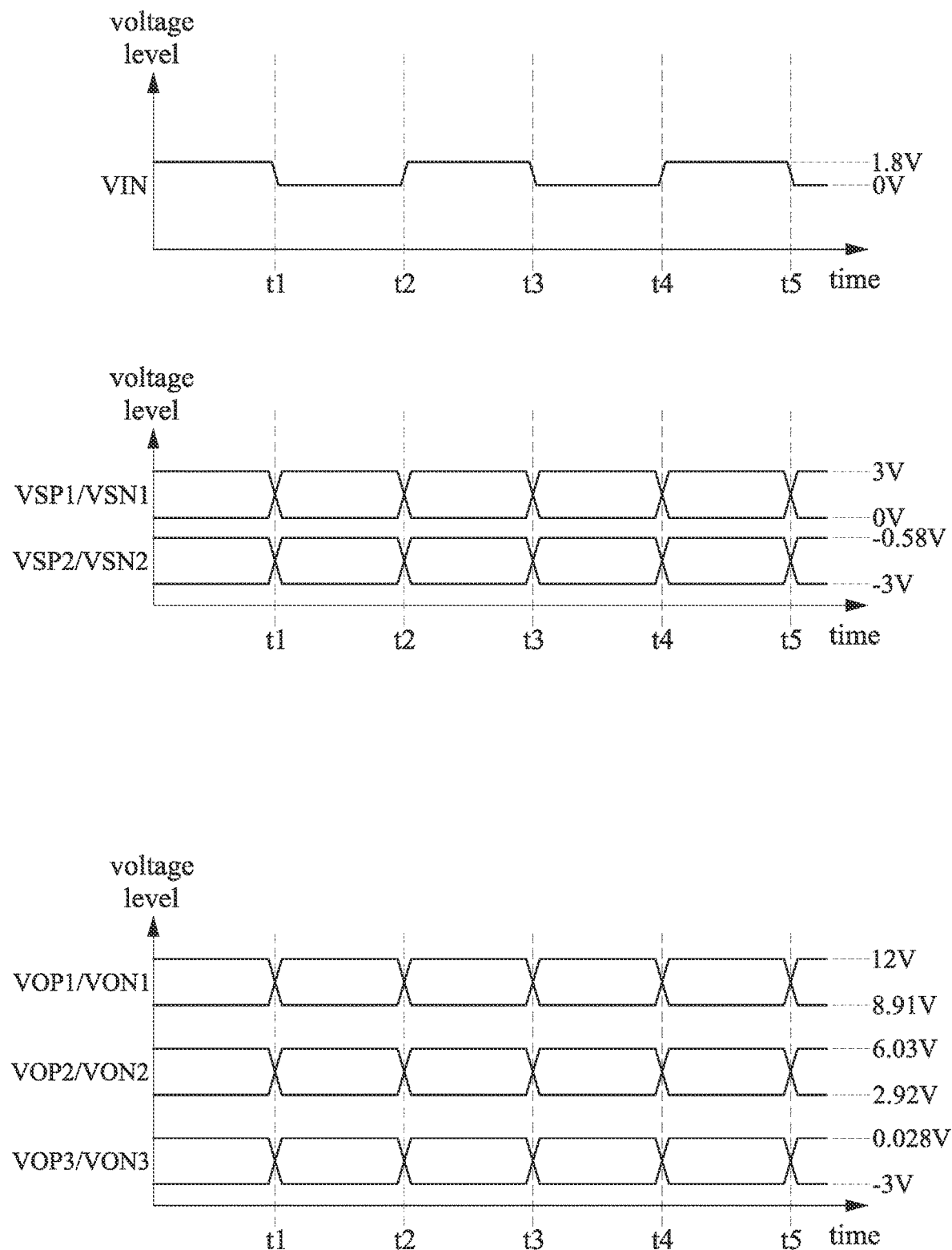
FIG. 3 depicts timing diagrams for an operation of the level shifter in FIG. 2A and FIG. 2B.

A description is provided with reference to FIG. 3. FIG. 3 depicts timing diagrams for an operation of the level shifter in FIG. 2A and FIG. 2B. FIG. 3 depicts timing diagrams of the input signal VIN, the first signal VSP1, the first inverted signal VSN1, the second signal VSP2, the second inverted signal VSN2, and the output signals VOP1~VOP3 and VON1~VON3 in the level shifter 100 in FIG. 2A and FIG. 2B from a time point t1 to a time point t5.

As shown in FIG. 3, the input signal VIN is operated (switched) between 0 and 1.8 volts. The first signal VSP1 and the first inverted signal VSN1 are operated (switched) in a positive voltage domain (0~3V). The second signal VSP2 and the second inverted signal VSN2 are operated (switched) in the negative voltage domain (−0.58~−3V).

When the input voltage VIN is at 1.8 volts, the first signal VSP1 and the second signal VSP2 are at 3 volts and −0.58 volts, respectively, and the first inverted signal VSN1 and the second inverted signal VSN2 are at 0 volts and −3 volts, respectively. When the input voltage VIN is at 0 volts, the first signal VSP1 and the second signal VSP2 are at 0 volts and −3 volts, respectively, and the first inverted signal VSN1 and the second inverted signal VSN2 are at 3 volts and −0.58 volts, respectively.

It is noted that the first voltage divider transistor TB11 will transmit the potential of the first system high voltage terminal VDD (1.8V) to a second terminal of the first voltage divider transistor TB11 until a potential of the gate terminal of the first voltage divider transistor TB11 reaches a potential of its source terminal plus a threshold voltage, the first voltage divider transistor TB11 is then cut off. That is to say, if the threshold voltage of the first voltage divider transistor TB11 is 2.4 volts, a potential of the second terminal of the first voltage divider transistor TB11 will be at −0.6 volts. That is, the first inner bias VB1 is −0.6 volts.

Additionally, the second voltage divider transistor TB21 will transmit the potential of the second system high voltage terminal VGH (12V) to a second terminal of the second voltage divider transistor TB21 until a potential of the gate terminal of the second voltage divider transistor TB21 reaches a potential of its source terminal plus a threshold voltage, the second voltage divider transistor TB21 is then cut off. That is to say, if the threshold voltage of the second voltage divider transistor TB21 is 3 volts, a potential of the second terminal of the second voltage divider transistor TB21 will be at 9 volts. That is, the second inner bias VB1 is 9 volts. Similarly, it can be deduced that the second inner biases VB3, VB4, and VB5 are 6 volts, 3 volts, and 0 volts, respectively.

Between the time points t1 and t2, when a level of the input signal VIN is switched from 1.8 volts before the time point t1 to 0 volts, the buffer circuit 120 provides the 3 volt first inverted signal VSN1 to the pull-up transistor TPU2 and provides the 0 volt first signal VSP1 to the pull-up transistor TPU1, so that the pull-up transistor TPU2 is turned off and the pull-up transistor TPU1 is turned on.

Turning on the pull-up transistor TPU1 will transmit the potential of the first system high voltage terminal VDD (1.8V) to the first terminal of the first stacking transistor TS11.

Since a potential of the first terminal (source terminal) of the first stacking transistor TS11 is at 1.8 volts and the gate terminal of the first stacking transistor TS11 receives the first inner bias VB1 (−0.6V), the first stacking transistor TS11 is turned on and transmits the potential of the first system high voltage terminal VDD (1.8V) to the first terminal of the first stacking transistor TS13.

Since the gate terminal of the first stacking transistor TS13 receives the first inner bias VB1 (−0.6V), a potential of the second terminal of the first stacking transistor TS13 will rise until the first stacking transistor TS13 is cut off. At this time, the potential of the second terminal of the first stacking transistor TS13 is approximately −0.58 volts. In this manner, the potential of −0.58 volts is used as the second inverted signal VSN2 and transmitted to the gate terminal of the pull-down transistor TPD1 in the second shift circuit 140.

The second inverted signal VSN2 that is at −0.58 volts turns on the first cross-coupled transistor TC12, so that the first cross-coupled transistor TC12 transmits the potential of the system low voltage terminal VGL (−3V) to the first terminal of the first cross-coupled transistor TC12, and the potential of the system low voltage terminal VGL (−3V) is used as the second signal VSP2 and is output. The second signal VSP2 that is at −3 volts turns off the first cross-coupled transistor TC11.

Since the second terminal (source terminal) of the first stacking transistor TS14 is at −3 volts and the gate terminal of the first stacking transistor TS14 receives the first inner bias VB1 (−0.6V), the first stacking transistor TS14 is turned on to transmit the potential of the system low voltage terminal VGL (−3V) to the first terminal of the first stacking transistor TS14.

Since the second terminal of the first stacking transistor TS12 is at −3 volts and the gate terminal of the first stacking transistor TS12 receives the first inner bias VB1 (−0.6V), a potential of the first terminal of the first stacking transistor TS12 will drop until the first stacking transistor TS12 is cut off. At this time, the potential of the first terminal of the first stacking transistor TS12 is approximately −0.58 volts.

Therefore, between the time points t1 and t2, when the level of the input signal VIN is switched from the 1.8 volts before the time point t1 to 0 volts, the first shift circuit 130 provides the second signal VSP2 with the potential of −3 volts to the gate terminal of the pull-down transistor TPD2 and provides the second inverted signal VSN2 with the potential of −0.58 volts to the gate terminal of the pull-down transistor TPD1, so that the pull-down transistor TPD1 is turned on and the pull-down transistor TPD2 is turned off.

Turning on the pull-down transistor TPD1 will transmit the potential of the system low voltage terminal VGL (−3V) to the second terminal (source terminal) of the third stacking transistor TS37, and the potential of −3V is used as the output signal VOP3 and is output.

Since the second terminal (source terminal) of the third stacking transistor TS37 is at −3 volts and the gate terminal of the third stacking transistor TS37 receives the second inner bias VB5 (0V), the third stacking transistor TS37 is turned on and transmits the potential of the system low voltage terminal VGL (−3V) to the second terminal of the third stacking transistor TS35.

Since the gate terminal of the third stacking transistor TS35 receives the second inner bias VB5 (0V), a potential of the first terminal (source terminal) of the third stacking transistor TS35 will drop until the third stacking transistor TS35 is cut off. At this time, the potential of the first terminal (source terminal) of the third stacking transistor TS35 is approximately −0.07 volts.

Since the gate terminal of the third stacking transistor TS33 receives the second inner bias VB4 (3V), the third stacking transistor TS33 is turned on to transmit the potential of the first terminal of the third stacking transistor TS35 to the first terminal of the third stacking transistor TS33.

Since the gate terminal of the third stacking transistor TS31 receives the second inner bias VB4 (3V), a potential of the first terminal (source terminal) of the third stacking transistor TS31 will drop until the third stacking transistor TS31 is cut off. At this time, the potential of the first terminal of the third stacking transistor TS31 is approximately 2.92 volts, and the potential of 2.92 volts is used as the output signal VOP2 and is output.

Since the second terminal (source terminal) of the second stacking transistor TS27 is at 2.92 volts and the gate terminal of the second stacking transistor TS27 receives the second inner bias VB1 (6V), the second stacking transistor TS27 is turned on to transmit a potential of the second terminal of the second stacking transistor TS27 (2.92 volts) to the first terminal of the second stacking transistor TS27.

Since the gate terminal of the second stacking transistor TS25 receives the second inner bias VB3 (6V), a potential of the first terminal (source terminal) of the second stacking transistor TS25 will drop until the second stacking transistor TS25 is cut off. At this time, the potential of the first terminal of the second stacking transistor TS25 is approximately 5.92 volts.

Since the second terminal (source terminal) of the second stacking transistor TS23 is at 5.92 volts and the gate terminal of the second stacking transistor TS23 receives the second inner bias VB2 (9V), the second stacking transistor TS23 is turned on to transmit the potential of the first terminal of the second stacking transistor TS25 (5.92 volts) to the first terminal of the second stacking transistor TS23.

Since the gate terminal of the second stacking transistor TS21 receives the second inner bias VB2 (9V), a potential of the first terminal (source terminal) of the second stacking transistor TS21 will drop until the second stacking transistor TS21 is cut off. At this time, the potential of the first terminal of the second stacking transistor TS21 is approximately 8.91 volts, and the potential of 8.91 volts is used as the output signal VOP1 and is output.

The output signal VOP1 that is at 8.91 volts turns on the second cross-coupled transistor TC22, so that the second cross-coupled transistor TC22 transmits the potential of the second system high voltage terminal VGH (12V) to the second terminal of the second cross-coupled transistor TC22, and the potential of the second system high voltage terminal VGH (12V) is used as output signal VON1 and is output. The output signal VON1 that is at 12 volts turns off the second cross-coupled transistor TC21.

Since the first terminal (source terminal) of the second stacking transistor TS22 is at 12 volts and the gate terminal of the second stacking transistor TS22 receives the second inner bias VB2 (9V), the second stacking transistor TS22 is turned on and transmits the potential of the second system high voltage terminal VGH (12V) to the second terminal of the second stacking transistor TS22 (2.92 volts).

Since the gate terminal of the second stacking transistor TS24 receives the second inner bias VB2 (9V), a potential of the second terminal (source terminal) of the second stacking transistor TS24 will rise until the second stacking transistor TS24 is cut off. At this time, the potential of the second terminal of the second stacking transistor TS24 is approximately 9.03 volts.

Since the first terminal (source terminal) of the second stacking transistor TS26 is at 9.03 volts and the gate terminal of the second stacking transistor TS26 receives the second inner bias VB3 (6V), the second stacking transistor TS26 is turned on to transmit a potential of the first terminal of the second stacking transistor TS26 (9.03 volts) to the second terminal of the second stacking transistor TS26.

Since the gate terminal of the second stacking transistor TS28 receives the second inner bias VB3 (6V), a potential of the second terminal (source terminal) of the second stacking transistor TS28 will rise until the second stacking transistor TS28 is cut off. At this time, the potential of the second terminal of the second stacking transistor TS28 is approximately 6.03 volts, and the potential of 6.03 volts is used as the output signal VON2 and is output.

Since the first terminal (source terminal) of the third stacking transistor TS32 is at 6.03 volts and the gate terminal of the third stacking transistor TS32 receives the second inner bias VB4 (3V), the third stacking transistor TS32 is turned on to transmit a potential of the first terminal of the third stacking transistor TS32 (6.03 volts) to the first terminal of the third stacking transistor TS34.

Since the gate terminal of the third stacking transistor TS34 receives the second inner bias VB4 (3V), a potential of the second terminal (source terminal) of the third stacking transistor TS34 will rise until the third stacking transistor TS34 is cut off. At this time, the potential of the second terminal of the third stacking transistor TS34 is approximately 3.03 volts.

Since the first terminal (source terminal) of the third stacking transistor TS36 is at 3.03 volts and the gate terminal of the third stacking transistor TS36 receives the second inner bias VB5 (0V), the third stacking transistor TS36 is turned on to transmit a potential of the first terminal of the third stacking transistor TS36 (3.03 volts) to the second terminal of the third stacking transistor TS36.

Since the gate terminal of the third stacking transistor TS38 receives the second inner bias VB5 (0V), a potential of the second terminal (source terminal) of the third stacking transistor TS38 will rise until the third stacking transistor TS38 is cut off. At this time, the potential of the second terminal of the third stacking transistor TS38 is approximately 0.028 volts, and the potential of 0.028 volts is used as the output signal VON3 and is output.

When the level of the input signal VIN is switched from 0 volts to 1.8 volts, the output signals VOP1, VOP2, VOP3, VON1, VON2 and VON3 of the level shifter 100 are at 12 volts, 6.03 volts, 0.028 volts, 8.91 volts, 2.92 volts and −3 volts, respectively. When the level of the input signal VIN is switched from 0 volts to 1.8 volts, the operation method of the level shifter 100 is in mirror symmetry to the operation method when the level of the input signal VIN is switched from 1.8 volts to 0 volts. Therefore, a description in this regard is not repeated here.

As a result, the output signals VOP1 and VON1 are switched between 12 and 8.91 volts. The output signals VOP2 and VON2 are switched between 6.03 and 2.92 volts. The output signals VOP3 and VON3 are switched between 0.028 and −3 volts.

Figure 4:
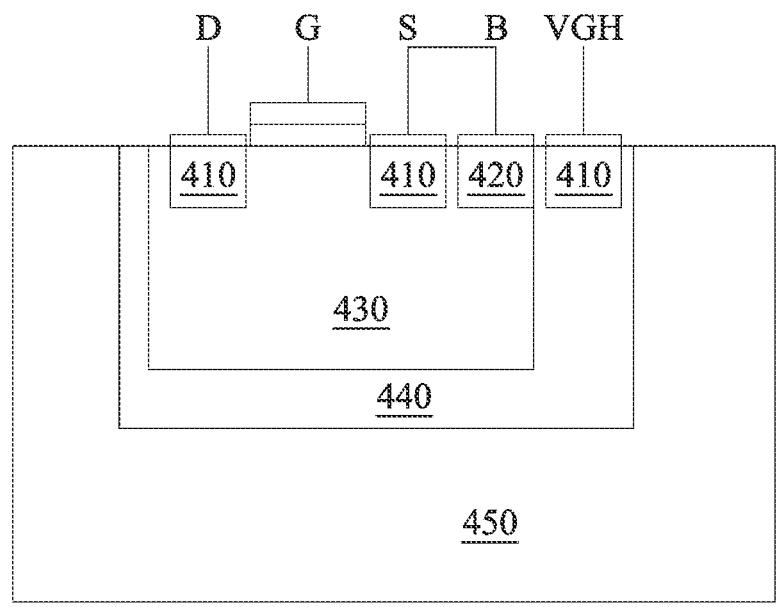
FIG. 4 depicts a schematic structure diagram of an N-type transistor in the level shifter in FIG. 2A and FIG. 2B.

A description is provided with reference to FIG. 4. FIG. 4 depicts a schematic structure diagram of an N-type transistor in the level shifter 100 in FIG. 2A and FIG. 2B. As shown in FIG. 4, the N-type transistor with an N-well includes a number of n+ areas 410, a p+ area 420, a P-well 430, a deep N-well 440, and a P-type substrate 450.

In addition to that, D, G, B and S in FIG. 4 respectively represent the drain terminal, the gate terminal, the base terminal, and the source terminal of the transistor. As shown in FIG. 4, the base terminal B in the transistor is electrically coupled to the source terminal S to eliminate the body effect. In addition, the deep N-well 440 is electrically coupled to the second system high voltage terminal VGH to avoid breakdown of the PN junctions of the transistor when operating in a negative voltage domain, thus setting the potential of the system low voltage terminal VGL to −3 volts.

In summary, the level shifter 100 utilizes the two-stage first shift circuit 130 and second shift circuit 140 to output the shifted output signals VOP1, VON1, VOP2, VON2, VOP3, and VON3, so as to increase the shift range of the output signals VOP1, VON1, VOP2, VON2, VOP3, VON3. Additionally, by electrically coupling the deep N-well of the N-type metal oxide semiconductor with the deep N-well to the second system high voltage terminal VGH, the system low voltage terminal VGL can be set to a negative value. The PN junctions of the transistor do not break down to increase the shift range of the output signals VOP1, VON1, VOP2, VON2, VOP3, VON3 of the level shifter 100. In addition to that, the present disclosure utilizes the first voltage divider circuit 132 and the second voltage divider circuit 142 to provide the first inner bias VB1 and the second internal biases VB2~VB5, thus reducing the circuit area for generating control signals.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A level shifter comprising:

a buffer circuit providing a first signal and a first inverted signal of opposite phases;

a first shift circuit electrically coupled between a first system high voltage terminal and a system low voltage terminal, and the first shift circuit being configured to provide a second signal and a second inverted signal of the opposite phases according to the first signal and the first inverted signal, wherein the first shift circuit comprises:

a plurality of first stacking transistors; and a first voltage divider circuit electrically coupled between the first system high voltage terminal and the system low voltage terminal, and being configured to provide a first inner bias to gate terminals of the first stacking transistors; and a second shift circuit electrically coupled between a second system high voltage terminal and the system low voltage terminal, wherein the second shift circuit generates a plurality of output signals according to the second signal and the second inverted signal.

2. The level shifter of claim 1, wherein the first shift circuit further comprises:

two pull-up transistors electrically coupled to the first system high voltage terminal, the two pull-up transistors being enabled respectively according to the first signal and the first inverted signal; and two first cross-coupled transistors electrically coupled to the system low voltage terminal, the two first cross-coupled transistors being enabled respectively according to the second signal and the second inverted signal, wherein the first stacking transistors are electrically coupled between the two pull-up transistors and the two first cross-coupled transistors.

3. The level shifter of claim 2, wherein each of the two first cross-coupled transistors is implemented by an N-type metal oxide semiconductor with a deep N-well, wherein the deep N-well of each of the two first cross-coupled transistors is electrically coupled to the second system high voltage terminal, wherein a base terminal and a source terminal of each of the two first cross-coupled transistors are electrically coupled.

4. The level shifter of claim 2, wherein the first voltage divider circuit comprises:

two first voltage divider transistors electrically coupled between the first system high voltage terminal and the system low voltage terminal, the two first voltage divider transistors being configured to provide the first inner bias to the gate terminals of the first stacking transistors.

5. The level shifter of claim 1, wherein the second shift circuit comprises:

a second voltage divider circuit electrically coupled between the second system high voltage terminal and a ground terminal, and being configured to provide a plurality of second inner biases.

6. The level shifter of claim 5, wherein a voltage of the system low voltage terminal is lower than a voltage of the ground terminal.

7. The level shifter of claim 5, wherein the second shift circuit further comprises:
- two second cross-coupled transistors electrically coupled between the second system high voltage terminal and two first output terminals;
- a plurality of second stacking transistors electrically coupled between the two first output terminals and two second output terminals, the second stacking transistors being configured to respectively receive one part of the second inner biases;
- a plurality of third stacking transistors electrically coupled between the two second output terminals and two third output terminals, the third stacking transistors being configured to respectively receive another part of the second inner biases; and
- two pull-down transistors electrically coupled between the two third output terminals and the system low voltage terminal, the two pull-down transistors being enabled according to the second signal and the second inverted signal, wherein the two first output terminals, the two second output terminals, and the two third output terminals are configured to output the output signals.

8. The level shifter of claim 7, wherein the second voltage divider circuit comprises:
- a plurality of second voltage divider transistors electrically coupled between the second system high voltage terminal and a node, the second voltage divider transistors being configured to provide the part of the second inner biases to gate terminals of the second stacking transistors; and
- a plurality of third voltage divider transistors electrically coupled between the node and the ground terminal, the third voltage divider transistors being configured to provide the another part of the second inner biases to gate terminals of the third stacking transistors.

9. The level shifter of claim 1, wherein a voltage of the second system high voltage terminal is higher than a voltage of the first system high voltage terminal.

10. The level shifter of claim 1, wherein the first signal and the first inverted signal operate in a positive voltage domain, wherein the second signal and the second inverted signal operate in a negative voltage domain.

* * * * *